(12) United States Patent
Cai et al.

(10) Patent No.: US 9,293,454 B2
(45) Date of Patent: Mar. 22, 2016

(54) BIPOLAR JUNCTION TRANSISTOR HAVING MULTI-SIDED BASE CONTACT

(71) Applicant: GLOBALFOUNDRIES Inc., Grand Cayman (KY)

(72) Inventors: Jin Cai, Cortlandt Manor, NY (US); Tak H. Ning, Yorktown Heights, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 14/521,605

(22) Filed: Oct. 23, 2014

(65) Prior Publication Data

US 2015/0041957 A1 Feb. 12, 2015

Related U.S. Application Data

(62) Division of application No. 13/343,688, filed on Jan. 4, 2012, now Pat. No. 8,946,040.

(51) Int. Cl.
| | | |
|---|---|---|
| *H01L 27/082* | (2006.01) | |
| *H01L 29/423* | (2006.01) | |
| *H01L 29/66* | (2006.01) | |
| *H01L 29/735* | (2006.01) | |
| *H01L 21/8249* | (2006.01) | |
| *H01L 29/10* | (2006.01) | |
| *H01L 29/45* | (2006.01) | |

(52) U.S. Cl.
CPC .......... *H01L 27/082* (2013.01); *H01L 21/8249* (2013.01); *H01L 29/1004* (2013.01); *H01L 29/42304* (2013.01); *H01L 29/45* (2013.01); *H01L 29/6625* (2013.01); *H01L 29/735* (2013.01)

(58) Field of Classification Search
CPC ............ H01L 21/8249; H01L 27/0623; H01L 29/0821; H01L 29/7322; H01L 29/1004; H01L 29/66234; H01L 29/41708; H01L 29/73
See application file for complete search history.

(56) References Cited

U.S. PATENT DOCUMENTS

| | | | | |
|---|---|---|---|---|
| 4,812,894 | A * | 3/1989 | Nakamura et al. ............ | 257/515 |
| 6,812,545 | B2 | 11/2004 | Dunn et al. .................... | 257/565 |
| 2001/0054746 | A1 | 12/2001 | Yamada et al. ................ | 257/565 |
| 2005/0242373 | A1 | 11/2005 | Ahlgren et al. ................ | 257/197 |
| 2006/0148187 | A1 | 7/2006 | Yoon ............................. | 438/321 |
| 2008/0318373 | A1 | 12/2008 | Akatsu et al. .................. | 438/205 |
| 2009/0029536 | A1 | 1/2009 | Chen et al. ..................... | 438/527 |
| 2010/0271641 | A1* | 10/2010 | Gupta et al. ................... | 358/1.8 |
| 2012/0228611 | A1* | 9/2012 | Chan et al. ..................... | 257/51 |

\* cited by examiner

*Primary Examiner* — Bac Au
(74) *Attorney, Agent, or Firm* — Heslin Rothenberg Farley & Mesiti P.C.; George Blasiak

(57) ABSTRACT

A Bipolar Junction Transistor with an intrinsic base, wherein the intrinsic base includes a top surface and two side walls orthogonal to the top surface, and a base contact electrically coupled to the side walls of the intrinsic base. In one embodiment an apparatus can include a plurality of Bipolar Junction Transistors, and a base contact electrically coupled to the side walls of the intrinsic bases of each BJT.

14 Claims, 7 Drawing Sheets

BIPOLAR JUNCTION TRANSISTOR HAVING MULTI-SIDED BASE CONTACT

CROSS-REFERENCE TO RELATED APPLICATIONS

This application is a divisional application of and claims priority under 35 U.S.C. §120 to U.S. patent application Ser. No. 13/343,688 ("BIPOLAR JUNCTION TRANSISTOR HAVING MULTI-SIDED BASE CONTACT") filed Jan. 4, 2012.

BACKGROUND

This invention relates to Bipolar Junction Transistors (BJT), and more particularly to BJTs with a base contact electrically coupled to the side walls of the BJTs intrinsic base.

A Bipolar Junction Transistor (BJT) is a three terminal electronic device commonly used in amplifying or switching applications. BJTs can be used both for high-power switch applications such as switched mode power supplies and for low-power switch applications such as logic gates. BJTs are also commonly used in vast numbers of products as amplifiers to provide either current gain, voltage gain, and sometimes both. From mobile phones to televisions, BJTs are used to provide sound reproduction, radio transmission, and signal processing.

A BJT is generally constructed of doped semiconductor material and its operation involves both electron and hole migration. A BJT can operate under different types of operation modes such as forward and reverse active, or cutoff and saturation mode depending on the biasing voltage applied. The Maximum Oscillation Frequency fmax is an important parameter to a BJT because it is the maximum frequency at which useful power can be expected from a device. There is therefore a continuing need for Bipolar Junction Transistor designs to deliver a higher maximum oscillation frequency.

BRIEF SUMMARY

Accordingly, one example aspect of the present invention is a Bipolar Junction Transistor (BJT) with an intrinsic base which includes a top surface and two side walls orthogonal to the top surface. The BJT also includes a base contact electrically coupled to the side walls of the intrinsic base.

Another example of the present invention is an apparatus including a plurality of Bipolar Junction Transistors (BJTs). Each BJT has an intrinsic base with a top surface and two side walls orthogonal to the top surface. The apparatus also has a base contact that is electrically coupled to the side walls of the intrinsic bases.

Yet another example of the present invention is a method for fabricating a bipolar junction transistor (BJT) with a small base resistance. The method includes depositing a silicon layer over a substrate. The substrate may comprise an insulator layer on a handle substrate. In a particular embodiment, the material for building the transistor of present invention is semiconductor-on-insulator (SOI). A patterning step patterns an intrinsic base of the BJT within the silicon layer. The intrinsic base includes a top surface and two side walls orthogonal to the top surface. A base contact is formed that is electrically coupled to the side walls of the intrinsic base.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
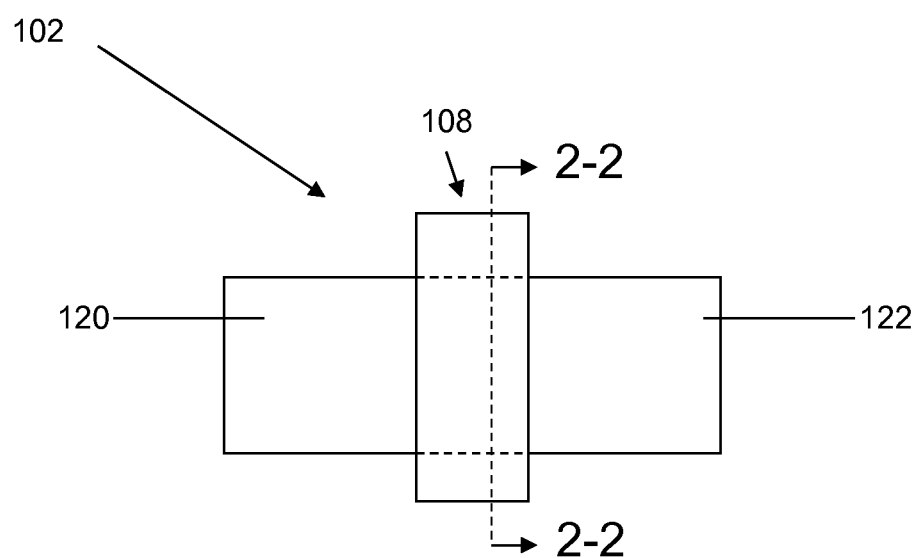
FIG. 1 shows a Bipolar Junction Transistor according to one embodiment of the present invention.

The present invention is described with reference to embodiments of the invention. Throughout the description of the invention reference is made to FIGS. 1-7. When referring to the figures, like structures and elements shown throughout are indicated with like reference numerals.

FIG. 1 shows a Bipolar Junction Transistor (BJT) 102 according to one embodiment of the present invention. The BJT 102 can have a base contact 108 electrically coupled to the side walls 106 of the intrinsic base 126. In one embodiment, the base contact 108 may be constituted of polycrystalline silicon.

Figure 2:
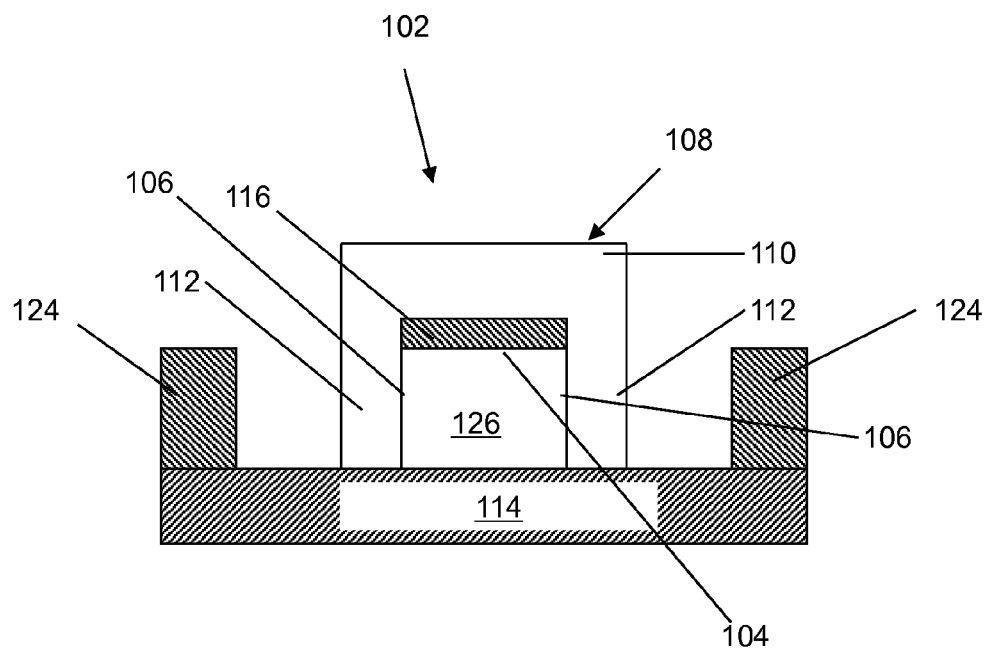
FIG. 2 shows the Bipolar Junction Transistor of FIG. 1 along cross-sectional line 2-2.

FIG. 2 shows the Bipolar Junction Transistor (BJT) 102 of FIG. 1 along cross-sectional line 2-2. As shown, the BJT's intrinsic base 126 can include a top surface 104 and two side walls 106 substantially orthogonal to the top surface 104.

In one embodiment, the BJT 102 can have a base contact 108 electrically coupled to the side walls 106 of the intrinsic base 126. The BJT's base contact 108 can include a top member 110 positioned over the top surface 104 of the intrinsic base 126 and side members 112 extending from the top member 110 along the side walls 106 of the intrinsic base 126. In addition, there can exist a buried oxide layer 114 below the intrinsic base 126. Each of the base contact's side members 112 may extend from the top member 110 to the buried oxide layer 114. Furthermore, each of the base contact's side members 112 may include a side member surface in physical and electrical contact with one of the side walls 106 of the intrinsic base 126.

In one embodiment, the Bipolar Junction Transistor 102 may include an oxide insulation layer 116 between the top member of the base contact 110 and the top surface 104 of the intrinsic base 126.

Figure 3:
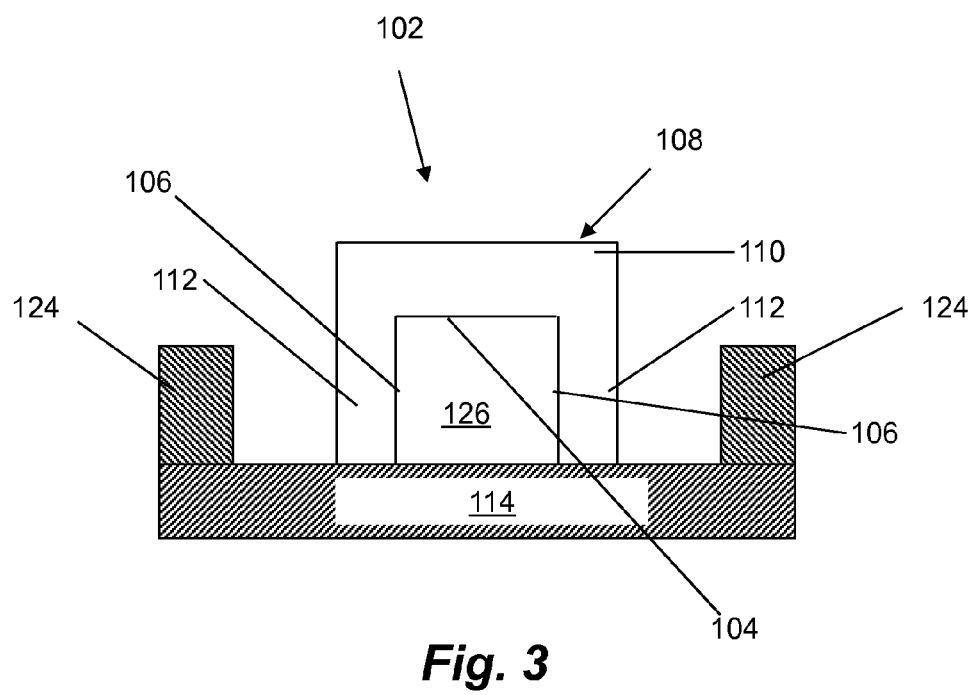
FIG. 3 shows a Bipolar Junction Transistor according to one embodiment of the present invention, along cross-sectional line 2-2 similar to FIG. 2.

FIG. 3 shows a Bipolar Junction Transistor (BJT) 102 according to one embodiment of the present invention. The BJT's 102 base contact's top member 110 can be in physical and electrical contact with the top surface 104 of the intrinsic base 126.

Figure 4:
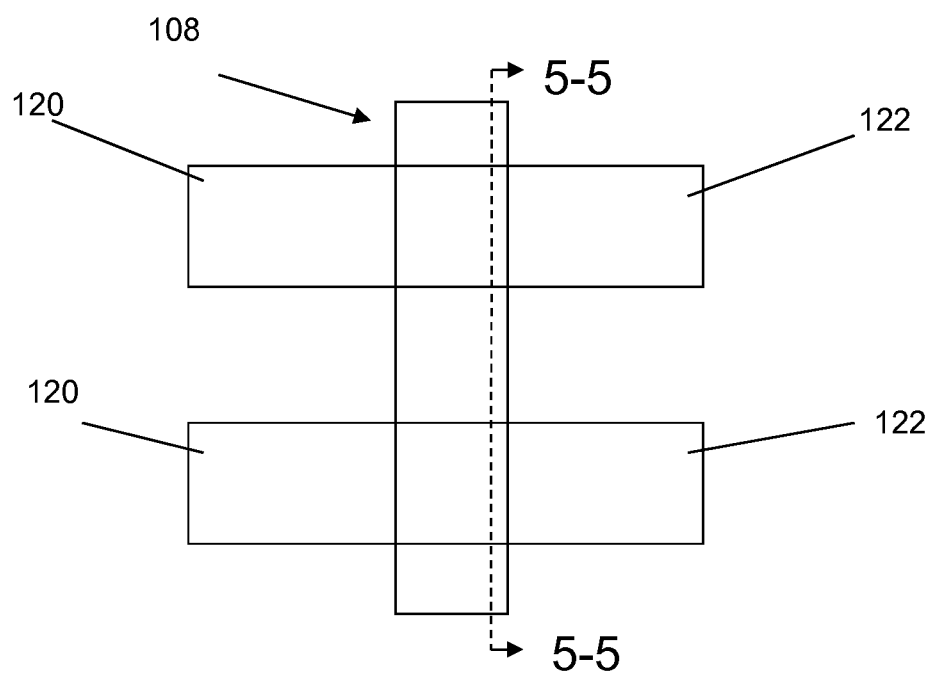
FIG. 4 shows an apparatus in accordance with one embodiment of the present invention.

FIG. 4 shows an apparatus in accordance with one embodiment of the present invention. The apparatus can include a plurality of Bipolar Junction Transistors (BJTs) 102. Furthermore, the apparatus may have a base contact 108 electrically coupled to the side walls 106 of the BJT's intrinsic bases 126. In one embodiment, the base contact 108 is constituted of polycrystalline silicon.

Figure 5:
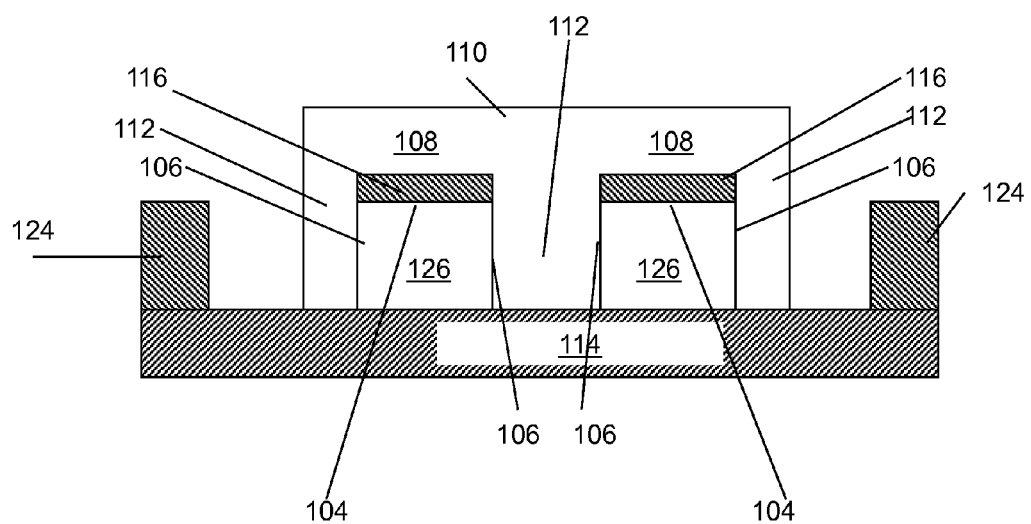
FIG. 5 shows the apparatus of FIG. 4 along cross-sectional line 5-5.

FIG. 5 shows the apparatus of FIG. 4 along cross-sectional line 5-5. As shown, the apparatus can have a plurality of Bipolar Junction Transistors 102 with intrinsic bases 126 each having a top surface 104 and two side walls 106 substantially orthogonal to the top surface 104.

In one embodiment, the apparatus can have a base contact 108 electrically coupled to the side walls 106 of the intrinsic bases 126. The apparatus's base contact 108 can include a top member 110 positioned over the top surface 104 of the intrinsic base 126 and side members 112 extending from the top member 110 along the side walls 106 of the intrinsic base 126. In addition, there can exist a buried oxide layer 114 below the intrinsic bases 126. Each of the base contact's side members 112 may extend from the top member 110 to the buried oxide layer 114. Furthermore, each of the base contact's side members 112 may include a side member surface in physical and electrical contact with one of the side walls 106 of the intrinsic base 126.

In one embodiment, the apparatus may include an oxide insulation layer 116 between the top member of the base contact 110 and the top surfaces 104 of the intrinsic bases 126.

Figure 6:
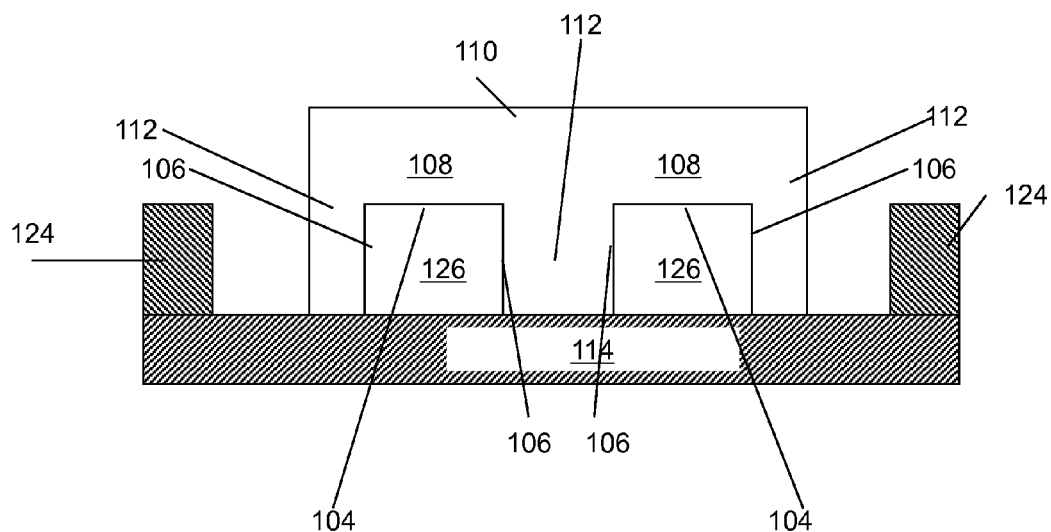
FIG. 6 shows an apparatus in accordance with one embodiment of the present invention, along cross-sectional line 5-5 similar to FIG. 5.

FIG. 6 shows an apparatus in accordance with one embodiment of the present invention. The apparatus's base contact's top member 110 can be electrically coupled to the top surfaces 104 of the intrinsic bases 126.

Figure 7:
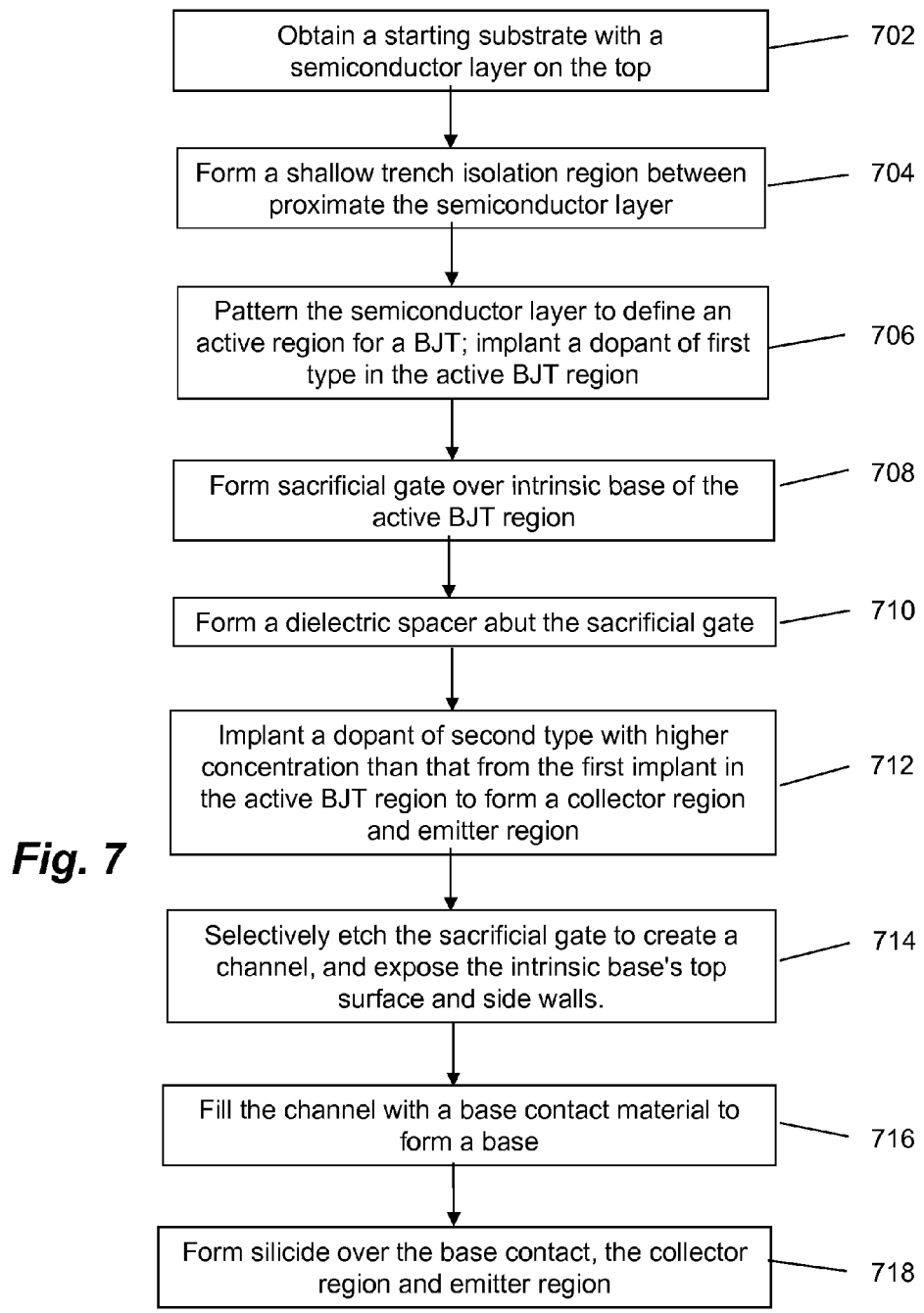
FIG. 7 shows a method for fabricating a Bipolar Junction Transistor with a small base resistance in accordance with one embodiment of the present invention.

FIG. 7 shows a method for fabricating a Bipolar Junction Transistor (BJT) 102 with a small base resistance in accordance with one embodiment of the present invention. The method starts with obtaining a substrate with a semiconductor layer on the top in step 702. After the completion of the deposition step 702, the method continues to forming step 704.

At forming step 704, a shallow trench isolation region 124 is formed between proximate the semiconductor layer before patterning the active semiconductor region of the BJT 102. After the forming step 704 is completed, the method continues to patterning step 706.

At patterning step 706, the active semiconductor region of the BJT 102 is patterned which includes the intrinsic base 126. The intrinsic base 126 can include a top surface 104 and two side walls 106 substantially orthogonal to the top surface 104. A dopant of first type is implanted in the patterned semiconductor region to define the doping concentration in the intrinsic base 126. the patterning and implantation step 706 is completed, the method continues to forming step 708.

At forming step 708, a sacrificial gate is formed over the intrinsic base 126 before forming the base contact 108. After the forming step 708 is completed, the method continues to forming step 710.

At forming step 710, a dielectric spacer is formed about the sacrificial gate. After the forming step 710 is completed, the method continues to implanting step 712.

At implanting step 712, a dopant of second type with a higher concentration than that from the first implanting step is implanted in the semiconductor layer to form a collector region 122 and emitter region 120 of the BJT 102. The implantation step 712 may use the sacrificial gate as an implanting mask for the intrinsic base 126. After the completion of implanting step 712, the method continues to etching step 714.

At etching step 714, the sacrificial gate over the intrinsic base 126 is selectively etched to create a channel. The etching step 714 can expose the top surface 104 and the side walls 106 of the intrinsic base 126 at the channel. After the completion of etching step 714, the method continues to filling step 716.

At filling step 716, a base contact is formed by filling the said channel created during step 714 with a base contact material. The base contact 108 (also known as extrinsic base region) can be constituted of polycrystalline silicon. The base contact 108 may include a top surface member 110 positioned over the top surface 104 of the intrinsic base 126 and side members 112 extending from the top member 110 along the side walls 106 of the intrinsic base 126. The base contact 108 may also be electrically coupled to the side walls 106 of the intrinsic base 126. After the completion of filling step 716, the method continues to forming step 718.

At forming step 718, silicide is formed over the base contact 108, the collector region and emitter region.

Accordingly, one embodiment of the invention is a transistor with a base contact electrically coupled to the side walls of the intrinsic base. According to an embodiment of the invention, the transistor may achieve a higher Maximum Oscillation Frequency (fmax) by reducing the transistor's base resistance (rb). The arrangement may reduce the transistor's base resistance because it increases the total number of contacting surfaces between the base contact and the intrinsic base.

In one embodiment, the transistor can include a base contact with a top member positioned over the top surface of the intrinsic base and side members extending from the top member along the side walls of the intrinsic base. The base contact's side members may include a side member surface in physical and electrical contact with one of the side walls of the intrinsic base. Furthermore, the base contact's top member may be in physical and electrical contact with the top surface of the intrinsic base. This arrangement can reduce the transistor's base resistance (rb), which increases the transistor's Maximum Oscillation Frequency (fmax) because fmax is dictated by:

$$f_{max} = \sqrt{\frac{f_T}{8\pi r_b C_{BC}}}$$

One embodiment of the invention is an apparatus comprising of a plurality of Bipolar Junction Transistors with one base contact electrically coupled to each transistor's intrinsic base's side walls. The base contact can have a top member positioned over the top surface of the intrinsic base and side members extending from the top member along the side walls of the intrinsic base. The base contact's side members may include a side member surface in physical and electrical contact with one of the side walls of the intrinsic base. Furthermore, the base contact's top member may be in physical and electrical contact with the top surface of the intrinsic base. This arrangement may enable the apparatus to achieve a higher Maximum Oscillation Frequency (fmax) by reducing each transistor's base resistance (rb). Furthermore, this arrangement may also increase the maximum amount of current to be drawn from a certain amount of surface area, because this arrangement allows more transistors to be placed within that certain amount of surface area.

Yet another embodiment of the present invention is a method for fabricating a bipolar junction transistor (BJT) with a small base resistance. The method starts with obtaining a substrate with a semiconductor layer on the top. This step is followed by a formation step for forming a shallow trench isolation regions between proximate the semiconductor layer. Next an active semiconductor region is patterned within the semiconductor layer including an intrinsic base, the intrinsic base including a top surface and two side walls substantially orthogonal to the top surface. A dopant of first type is implanted into the active semiconductor region. A sacrificial gate is then formed over the intrinsic base, as well as a dielectric spacer about the sacrificial gate. This is followed by a second implantation step for implanting a dopant of second type with higher concentration than that from the first implantation step in the semiconductor layer to form a collector region and emitter region of the BJT, wherein the sacrificial gate acts as an implanting mask for the intrinsic base. Then the sacrificial gate is selectively etched over the intrinsic base to create a channel, the top surface and the side walls of the intrinsic base being exposed at the channel. This is followed by a formation step where a base contact is formed by filling the channel with a base contact material, and this base contact is electrically coupled to the side walls of the intrinsic base. Then silicide is formed over the base contact, the collector region and emitter region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Bipolar Junction Transistor (BJT) comprising:
   a semiconductor layer;
   an emitter region implanted in the semiconductor layer;
   a collector region implanted in the semiconductor layer, the collector region spaced laterally from the emitter region such that no portion of the emitter region overlaps the collector region in a vertical direction;
   an intrinsic base of the BJT positioned between the emitter region and the collector region, the intrinsic base including a top surface and two side walls substantially orthogonal to the top surface; and
   a base contact electrically coupled to the side walls of the intrinsic base.

2. The Bipolar Junction Transistor of claim 1, wherein the base contact is polycrystalline silicon.

3. The Bipolar Junction Transistor of claim 1, wherein the base contact includes a top member positioned over the top surface of the intrinsic base and side members extending from the top member along the side walls of the intrinsic base.

4. The Bipolar Junction Transistor of claim 3, wherein the top member is electrically coupled to the top surface of the intrinsic base.

5. The Bipolar Junction Transistor of claim 3, wherein each of the side members includes a side member surface in physical and electrical contact with one of the side walls of the intrinsic base.

6. The Bipolar Junction Transistor of claim 3, further comprising:
   a buried oxide layer below the intrinsic base; and
   wherein each of the side members extends from the top member to the buried oxide layer.

7. The Bipolar Junction Transistor of claim 3, further comprising an oxide insulation layer between the top member of the base contact and the top surface of the intrinsic base.

8. An apparatus comprising:
   a semiconductor layer;
   a plurality of Bipolar Junction Transistors (BJTs), the BJTs including:
   emitter regions implanted in the semiconductor layer;
   collector regions implanted in the semiconductor layer, the collector regions spaced laterally from the emitter regions such that no portion of the emitter regions overlaps the collector regions in a vertical direction; and
   intrinsic bases, each of the intrinsic bases including:
   a top surface and two side walls substantially orthogonal to the top surface; and
   a base contact electrically coupled to the side walls of the intrinsic bases.

9. The apparatus of claim 8, wherein the base contact is polycrystalline silicon.

10. The apparatus of claim 8, wherein the base contact includes a top member positioned over the top surfaces of the intrinsic bases and side members extending from the top member along the side walls of the intrinsic bases.

11. The apparatus of claim 10, wherein the top member is electrically coupled to the top surfaces of the intrinsic bases.

12. The apparatus of claim 10, wherein each of the side members includes a side member surface in physical and electrical contact with one of the side walls of the intrinsic base.

13. The apparatus of claim 10, further comprising:
   a buried oxide layer below the intrinsic bases; and
   wherein each of the side members extends from the top member to the buried oxide layer.

14. The apparatus of claim 10, further comprising an oxide insulation layer between the top member of the base contact and the top surface of the intrinsic base.

* * * * *